United States Patent [19]

Shah et al.

[11] Patent Number: 4,584,682

[45] Date of Patent: Apr. 22, 1986

[54] RECONFIGURABLE MEMORY USING BOTH ADDRESS PERMUTATION AND SPARE MEMORY ELEMENTS

[75] Inventors: Siddharth R. Shah, Hopewell Junction; Shanker Singh, Fishkill, both of N.Y.; Vijendra P. Singh, Saratoga, Calif.

[73] Assignee: International Business Machines Corporation, Armonk, N.Y.

[21] Appl. No.: 528,718

[22] Filed: Sep. 2, 1983

[51] Int. Cl.[4] .................................................. G11C 13/00
[52] U.S. Cl. ..................................... 371/10; 365/200; 371/2; 371/11
[58] Field of Search ............... 371/10, 11, 2; 365/200, 365/201, 202

[56] References Cited

U.S. PATENT DOCUMENTS

| | | | |
|---|---|---|---|
| 3,772,652 | 11/1973 | Hillberg | 364/200 |
| 3,868,646 | 2/1975 | Bergman | 364/200 |
| 4,093,985 | 6/1978 | Das | 364/200 |
| 4,358,833 | 11/1982 | Folmsbee et al. | 365/200 |
| 4,380,066 | 4/1983 | Spencer et al. | 371/10 |
| 4,422,161 | 12/1983 | Kressel et al. | 364/200 |
| 4,453,248 | 6/1984 | Ryan | 371/11 |
| 4,460,998 | 7/1984 | Yamada et al. | 371/10 |
| 4,461,001 | 7/1984 | Bossen et al. | 371/11 |
| 4,485,471 | 12/1984 | Singh et al. | 371/2 |
| 4,489,403 | 12/1984 | Bond | 365/200 |

*Primary Examiner*—Charles E. Atkinson
*Attorney, Agent, or Firm*—James E. Murray

[57] ABSTRACT

An array substitution scheme is used to substitute a spare chip for a faulty chip when a UE condition results from an alignment of two errors in bit positions accessed through the same decoder while the bit permutation apparatus is used to misalign fault bits when they occur in bit positions accessed through different decoders.

2 Claims, 1 Drawing Figure

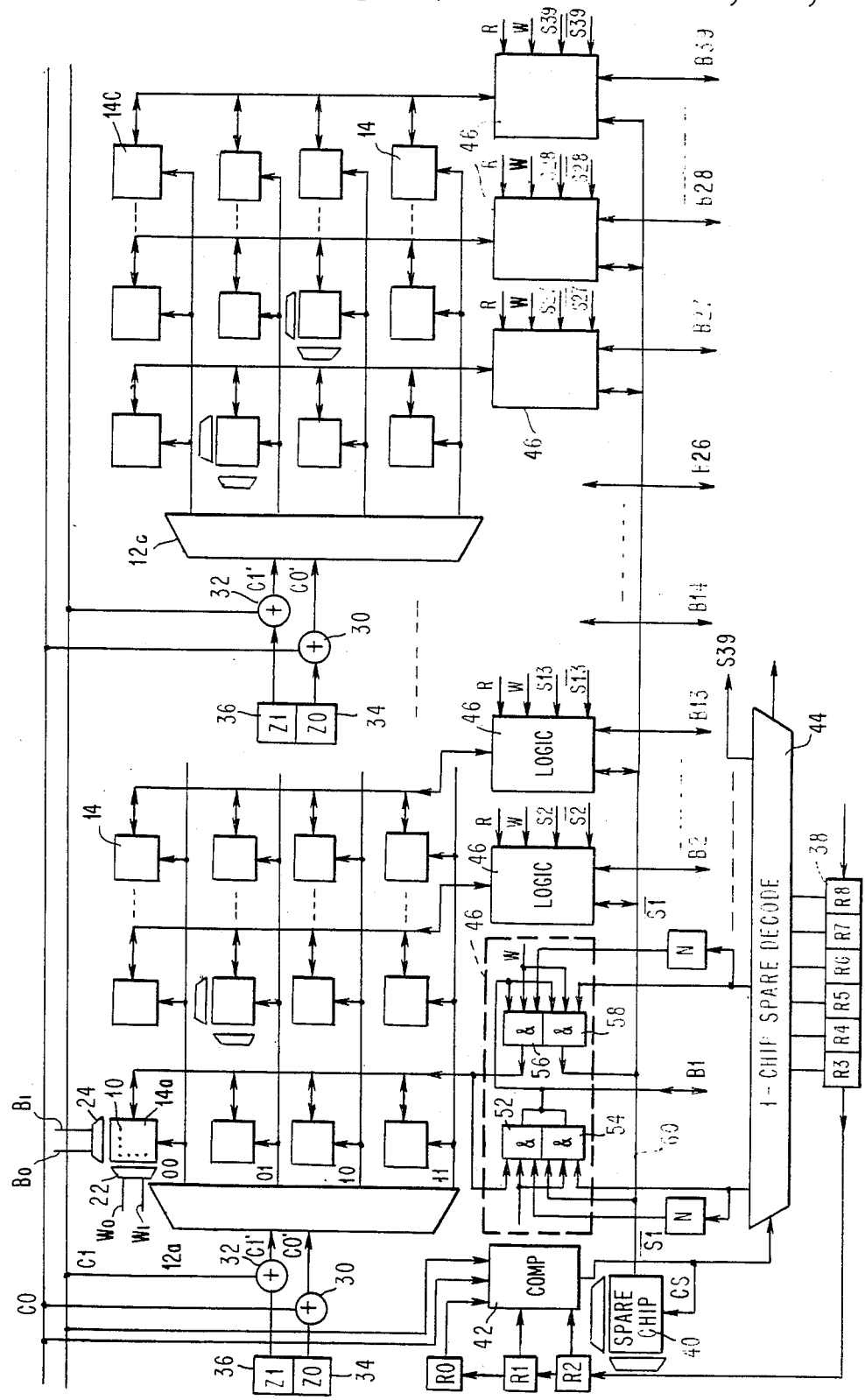

RECONFIGURABLE MEMORY USING BOTH ADDRESS PERMUTATION AND SPARE MEMORY ELEMENTS

BACKGROUND OF THE INVENTION

The present invention relates to changing words with uncorrectable errors (UE's) into memory words that can be corrected by the error correcting code protecting the data in the memory.

In copending Bossen et al patent application Ser. No. 362,925, filed Mar. 29, 1982, now U.S. Pat. No. 4,461,001, issued 7/17/84, and entitled "Deterministic Permutation Algorithm", a memory address register accesses a memory word by supplying the same logical address to decoders for all bit positions of the word. However, as a result of modification by logic circuitry, the address actually applied to the decoder of any particular bit position can differ from the logical address supplied by the address register. The logic circuitry is called permutation logic. Because of the permutation logic, a memory word can contain storage cells located at a number of different physical addresses that are not the logical address supplied by the memory register.

In the above mentioned U. S. patent application, memory arrays for each of the bit positions of the codewords of the memory are accessed through a separate chip row decoder so that it is possible to disperse uncorrectable errors (UE's) that result from faulty bits in any combination of bit positions in a codeword by swapping the logical addresses of arrays. While such a memory configuration is desirable from an error correction standpoint it would be more cost effective to have each chip row decoder access arrays in many bit positions in the codeword. For instance, instead of having thirty-nine chip row decoders access a separate row of arrays in a codeword with thirty-nine bit positions three decoders each access thirteen of the thirty-nine bit positions. With this configuration the permutation apparatus of the mentioned Bossen et al patent application would be capable of eliminating UE's that occur as a result of alignment of faults in bit positions accessed through different decoders but incapable of eliminating errors that occur as a result of faults that occur in bit positions accessed through the same decoder.

In copending Bond U.S. application Ser. No. 381,266, filed May 24, 1982, entitled "Fault Alignment Control System and Circuits", now U.S. Pat. No. 4,489,403, this intradecoder fault problem is handled by splitting an n bit decoder for a plurality of bit positions into a single bit decoder and a multibit decoder. Access is then accomplished on two axes of the matrix of arrays where n−1 of the bits access a particular row of arrays with two arrays in each of the plurality of bit positions and selection of one array out of the two in each bit position is then accomplished with the remaining address bit.

Fault dispersion is accomplished in this memory by using two different sets of translation control bits. In addition to row permutation logic described in the Bossen et al application, the Bond U.S. patent application employs an additional single bit translation logic associated with the single bit decoder to displace aligned faults in different arrays for bit positions accessed by the same chip row decoder. This single bit translation logic swaps the logical addresses of the two chips in any bit position accessed by the same row select address. Once the two chips are swapped to eliminate one UE the single translation bit cannot be used again to disperse UE's without first swapping arrays in the other bit positions to eliminate previously dispersed UE's.

In Singh et al U.S. patent application Ser. No. 528,769 filed on even date herewith and entitled "Memory Correction Scheme Using Spare Arrays", a technique and apparatus is described for substitution of a good array for a bad array where the good array can be substituted for an array in any row and column position in a matrix of arrays.

THE INVENTION

In accordance with the present invention the array substitution scheme described in the mentioned copending Singh et al application is used to substitute a spare ship for a faulty chip when a UE condition results from an alignment of two errors in bit positions accessed through the same decoder while the bit permutation apparatus is used to misalign faulty bits when they occur in bit positions accessed through different decoders. In the preferred implementation the same spare can be used for substitution for any arrays accessed by any decoder.

Therefore, it is an object of the present invention to use a sparing scheme in combination with a bit permutation scheme to eliminate uncorrectable error conditions in a memory.

It is another object of the present invention is to provide a memory element replacement scheme for use in combination with a bit permutation scheme.

THE DRAWINGS

These and other objects of the invention can best be understood by referring to the accompanying schematic diagram of a memory card incorporating the present invention.

DETAILED DESCRIPTION OF THE INVENTION

As shown in the figure, storage cells 10 of each bit position $B_1$–$B_{39}$ of a memory for storing codewords made up of 32 data and 7 check bits are accessed by three different chip row decoders 12 each decoder providing a chip select CS output for thirteen of the bit positions of the memory. The chip select output from each decoder selects a row of memory arrays each array 14 in a different one of the thirteen bit positions accessed by a given decoder. The arrays 14 are sixteen bit arrays with each bit 10 located at the intersection of a word line and a bit line.

A different word decoder 22 and a different bit decoder 24 access each of the arrays 16. They receive memory address register output bits $W_0$, $W_1$ and $B_0$,$B_1$ respectively. The chip decoders 12 each receive two address bits $C_0'$, $C_1'$ which are each the output of an Exclusive OR circuit 30 or 32 that receives one chip row address bit $C_0$ or $C_1$ from the memories address register and other input bit $Z_0$ or $Z_1$ from a stage 34 or 36 of a shift register. Therefore, if $Z_0$ and $Z_1$ are both zero, the chip decoders 12 will access the array at the physical address requested by the address register by providing a chip select CS to that chip. With any other binary combination of $Z_0$ and $Z_1$ in the shift register, the particular chip decoder 12 will access the array at one of the other three physical addresses accessed by the decoder.

To summarize then, the memory address register transmits the same six address bits $C_0$, $C_1$; $W_0$, $W_1$; and $B_0$, $B_1$. Address bits $W_0$, $W_1$ and $B_0$, $B_1$ access the same cell 10 in four different arrays 14 in each bit position. The chip address bits $C_0'$, $C_1'$ are each fed into an Exclusive OR circuit 30 or 32 where they are ExORed with $Z_0$ or $Z_1$ to generate modified chip address bits $C_0'$, $C_1'$. The modified chip address bits $C_0'$, $C_1'$ select the output of one of the four arrays or chips in each bit position to be read out as one of the bits $B_1$ to $B_{39}$ of the accessed word. If $Z_0$ and $Z_1$ are both zero, selected bit will be in the same bit position in the same array for all bit positions of the memory. If the register for any decoder contains data other than zeros the bit positions $B_i$ to $B_{i+12}$ accessed by that decoder will be a bit in the same $W_0$, $W_1$; $B_0$, $B_1$ position of another array 14.

Now, suppose the memory is protected by a single error correction/double error detection SEC/DED code and a two bit uncorrectable error (UE) occurs as a result of faults in the 2nd and 28th bit positions in a word in the 00 chip row line. If there is no faults at the same $W_0$, $W_1$ and $B_0$, $B_1$ address in the second bit position of the 01 chip row line, the register position Z0 for the first decoder 12a could be made 1 and register position Z1 could be made 0 to swap the chip in row position 00 with that in row position 01 so that the logical address of arrays in the row 00 and 01 bit the first thirteen bit positions of the memory would be changed. This would eliminate the detected UE condition and if the swapping did not cause alignment with other faults leave two words with correctable single bit errors.

The same corrective action would not be possible if the bit faults existed in the 2nd and 13th bit positions of a word because both those bit positions are accessed through the same decoder and a change in the logic address location of both bits would occur thereby changing the location of the uncorrectable error but not changing the uncorrectable error to two correctable errors. In accordance with the present invention, means are provided to substitute a spare array chip 40 for the appropriate faulted memory array chip 14 when a UE exists as a result in two different faulted chips being accessed through the same chip row decoder. For this purpose the nine bit shift register 38 receives a signal which will substitute the spare chip 40 for any array in the illustrated memory. The first bit $R_0$ of this shift register 38 determines whether the spare is to be used at all. If $R_0$ is "0", the spare 40 is maintained in a standby mode irrespective of the data in the other bit positions of the register 38. If $R_0$, is "1" then the next two bits $R_1$ and $R_2$ will determine in what chip row line of the memory the spare 40 will be placed. For instance, if $R_1$ and $R_2$ are both zeroes, the substitution will occur chip row line 00. If $R_1$ is one and $R_2$ is zero the substitution will occur on row line 01 and so on. Substitution is accomplished by comparing the data in stages $R_1$ and $R_2$ of the shift register 38 with the row address $C_0$ and $C_1$ in comparator 42. When there is a compare the output of the comparator is fed to the chip select terminal of the spare chip 40 activating the spare chip with a chip select signal. The bit line selected by the data will depend on the data in the remaining stages $R_3$ to $R_8$ of the shift register 38 which serve as inputs to a decoder 44 which is activated by the compare output of comparator 42. The decoder 44 receives the six bit input $R_3$ to $R_8$ from the shift register 38 and for each different combination of inputs and activates a different one and of its 39 output lines.

Logic circuits 46 control whether the array 16 or the spare chip 40 is accessed through any bit line in each bit position $B_1$ to $B_{39}$. So long as the output lines from the decoder 44 are all deactivated, the logic circuits 46 couple the bit lines 50 from arrays to the output bit line $B_1$ to $B_{39}$. However, if an output line of decoder 44 is activated on a binary "1" in any bit position the AND gates 52 to 58 deselects the bit line 50 in that bit position and substitutes the bit line 60 from the spare chip.

From the above description it can be seen the spare chip 40 can easily be substituted for any one of the thirty-nine bit positions serviced by the three decoders. Of course, if desirable more than one spare 40 could be used. Then an additional spare and duplicate spare selection circuitry is employed as is shown in the mentioned Singh et al copending U. S. application. Furthermore, 16 bit arrays are shown in the drawing to simplify the explanation of the invention. In fact, the arrays contain many more storage bits. Therefore it should be understood that many modifications and changes can be made in the illustrated embodiment of the invention without departing from the spirit and scope of the invention as represented in the attached claims.

Having thus described our invention, what we claim as new and desire to secure by Letters Patent is:

1. In a memory system for n bit code words protected by an error correcting-detecting code system with each of the n bit positions of each of the code words stored in a different set of memory arrays which sets are accessed through more than one but less than n decoders using a common logical array address supplied by the memory system to all of the decoders to select one of the memory arrays from each set, means for eliminating the cause of an uncorrectable error condition detected in a codeword by the error correction code system comprising permuting means for changing said common logical array address supplied to at least one of said decoders to a different actual address when said uncorrectable error condition is a result of at least two faulty bits in bit positions accessed through different decoders to disperse at least one of the faulty data bits to another codeword and thereby eliminate the cause of the detected uncorrectable error condition, and sparing means for substituting a spare memory array for a faulty memory array for eliminating the cause of said uncorrectable error condition when said uncorrectable error condition occurs as a result of at least two faulty bits in bit positions accessed through the same decoder, wherein said sparing means includes logic means for comparing said logical array address supplied to the decoder by the memory system to the actual array address of the faulty data bits and gating means for substituting the spare for the array containing said one of the faulty bits whereby the cause of the uncorrectable error condition can be eliminated whether the arrays containing the faulty data bits are accessed by the same or different decoders.

2. The memory system of claim 1 wherein said logic means includes means for substitution of the spare for any one of the n bit positions.

* * * * *